(12) United States Patent
Iida (10) Patent No.: US 8,138,040 B2
(45) Date of Patent: Mar. 20, 2012

(54) METHOD OF MANUFACTURING SEMICONDUCTOR DEVICE

(75) Inventor: Izuo Iida, Ashikaga (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/875,326

(22) Filed: Sep. 3, 2010

(65) Prior Publication Data

US 2011/0097860 A1  Apr. 28, 2011

(30) Foreign Application Priority Data

Oct. 22, 2009 (JP) ................................ 2009-243097

(51) Int. Cl.
*H01L 21/8238* (2006.01)
*H01L 21/8249* (2006.01)
*H01L 21/8234* (2006.01)

(52) U.S. Cl. ......... 438/210; 438/238; 438/234; 257/368

(58) Field of Classification Search .......... 438/323–327, 438/449–450, 234, 238, 210, 202–207, 225, 438/219, 247, 248; 257/368–376
See application file for complete search history.

(56) References Cited

U.S. PATENT DOCUMENTS

| | | | | |
|---|---|---|---|---|
| 4,554,729 A | * | 11/1985 | Tanimura et al. | 438/210 |
| 4,987,093 A | * | 1/1991 | Teng et al. | 438/450 |
| 5,045,483 A | * | 9/1991 | DeLong et al. | 438/331 |
| 5,134,088 A | * | 7/1992 | Zetterlund | 438/210 |
| 5,384,279 A | * | 1/1995 | Stolmeijer et al. | 438/217 |
| 5,719,081 A | * | 2/1998 | Racanelli et al. | 438/290 |
| 5,773,339 A | * | 6/1998 | Okamoto | 438/210 |
| 5,776,807 A | * | 7/1998 | Ronkainen et al. | 438/202 |
| 5,963,801 A | * | 10/1999 | Aronowitz et al. | 438/217 |
| 6,352,887 B1 | * | 3/2002 | Hutter et al. | 438/202 |
| 6,432,791 B1 | * | 8/2002 | Hutter et al. | 438/381 |

FOREIGN PATENT DOCUMENTS

JP  2001-110906  4/2001

* cited by examiner

*Primary Examiner* — Kiesha Bryant
*Assistant Examiner* — Dmitriy Yemelyanov
(74) *Attorney, Agent, or Firm* — Morrison & Foerster LLP (57) ABSTRACT

The invention provides a method of manufacturing a semiconductor device having a MOS transistor, a resistor element, etc on one semiconductor substrate, in which the number of masks and the number of manufacturing steps are decreased. In an NMOS formation region, a channel stopper layer is formed in a P type well by a first ion implantation process. Then a punch-through prevention layer is formed in the P type well by a second ion implantation process. On the other hand, in a first high resistor element formation region and a second high resistor element formation region, utilizing the first and second ion implantation processes, a resistor layer is formed in an N type well.

8 Claims, 5 Drawing Sheets

METHOD OF MANUFACTURING SEMICONDUCTOR DEVICE

CROSS-REFERENCE OF THE INVENTION

This application claims priority from Japanese Patent Application No. 2009-243097, the content of which is incorporated herein by reference in its entirety.

BACKGROUND OF THE INVENTION

Field of the Invention

The invention relates to a method of manufacturing a semiconductor device having a MOS transistor, a resistor element, etc on one semiconductor substrate.

For the purpose of providing a higher function to a semiconductor device (a semiconductor integrated circuit), conventionally, a resistor element and a bipolar transistor as well as a MOS transistor are integrated on one semiconductor substrate. For example, the MOS transistor is used to form a logic circuit, the resistor element is used as a feedback resistor for a crystal oscillator, and the bipolar transistor is used for a reference voltage generation circuit.

A method of forming a MOS transistor and a resistor element on one semiconductor substrate is disclosed in Japanese Patent Application Publication No. 2001-110906.

Since a semiconductor device of the type described above includes elements such as a resistor element and a bipolar transistor as well as a MOS transistor, the number of masks and the number of manufacturing processes increase compared with a basic MOS process.

SUMMARY OF THE INVENTION

The invention provides a method of manufacturing a semiconductor device having a first MOS transistor with a channel of a first type and a resistor element that are formed on a semiconductor substrate. The method includes forming a first element isolation film isolating a first region of the semiconductor substrate on which the first MOS transistor is formed from other portions of the semiconductor substrate, and performing a first ion implantation to form a first channel stopper layer in the first region and to form at least preliminarily a resistor layer of the resistor element in a second region of the semiconductor substrate. The first channel stopper layer prevents a channel formation under the first element isolation film. The method also includes performing a second ion implantation to form a first punch-through prevention layer in the first region and to add impurities to the resistor layer. The first punch-through prevention layer prevents a punch-through of the first MOS transistor.

BRIEF DESCRIPTION OF THE DRAWINGS

FIGS. 1A to 5C are cross-sectional views showing a method of manufacturing a semiconductor device of an embodiment of the invention.

DETAILED DESCRIPTION OF THE INVENTION

A method of manufacturing a semiconductor device of an embodiment of the invention will be described referring to FIGS. 1A to 5C. In the embodiment, a MOS transistor, a resistor element and a bipolar transistor are formed on one semiconductor substrate, and A, B and C of FIGS. 1A to 5C correspond to regions where the MOS transistor, the resistor element and the bipolar transistor are to be formed, respectively. The embodiment will be described assuming that the resistor element includes a first high resistor element having a sheet resistance value on the order of M$\Omega$/square and a second high resistor element having a lower sheet resistance value than the first high resistor element.

Figure 1A:
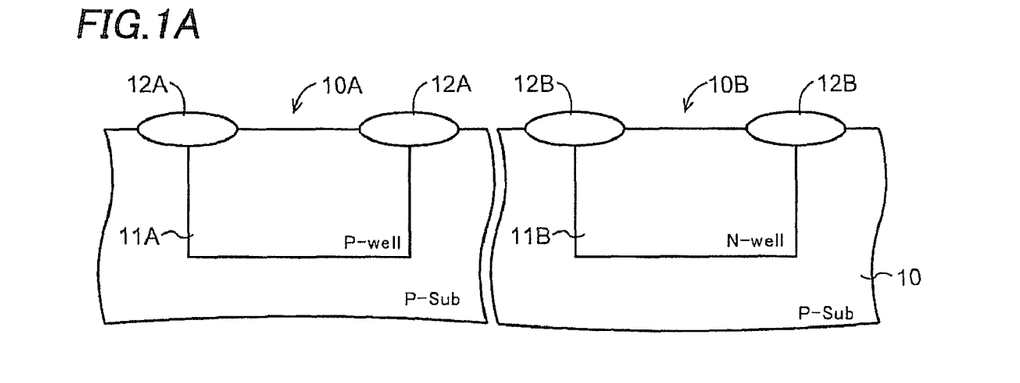

First, in a region 10A where an N-channel type MOS transistor is to be formed (hereafter, abbreviated to an NMOS formation region 10A) in FIG. 1A, a P type well 11A is formed on the front surface of a P type semiconductor substrate 10. Furthermore, in a region 10B where a P-channel type MOS transistor is to be formed (hereafter, abbreviated to a PMOS formation region 10B), an N type well 11B is formed on the front surface of the P type semiconductor substrate 10.

In this case, the P type well 11A is formed by ion-implanting boron ion ($^{11}B^+$) in the semiconductor substrate 10 under a condition of acceleration energy of 60 KeV and a dose of $8.5 \times 10^{12}/cm^2$ and then thermally diffusing this at about 1100° C. for eight hours, for example. The N type well 11B is formed at the same time as forming the P type well 11A by ion-implanting phosphorus ion ($^{31}P^+$) in the semiconductor substrate 10 under a condition of acceleration energy of 120 KeV and a dose of $7.5 \times 10^{12}/cm^2$ and then performing the thermal diffusion mentioned above to this, for example.

Then, by a selective oxidation process to the semiconductor substrate 10, a LOCOS film 12A is formed in the NMOS formation region 10A and a LOCOS film 12B is formed in the PMOS formation region 10B. The LOCOS films 12A, 12B are element isolation films that electrically isolate the corresponding PMOS and NMOS from the other elements respectively, and are formed so as to surround the P type well 11A and the N type well 11B as shown in the figure, for example. However, the invention is not limited to this, and these may be formed so as to have other planar pattern.

Figure 1B:
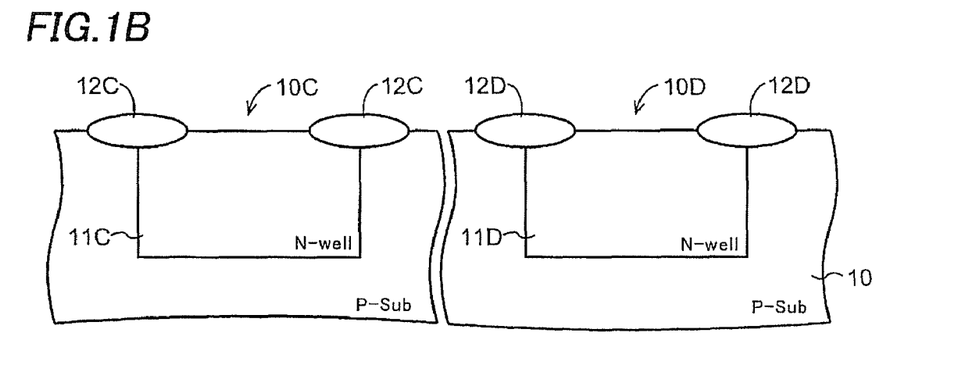

On the other hand, in a first high resistor element formation region 10C and a second high resistor element formation region 10D in FIG. 1B, N type wells 11C, 11D are respectively formed on the front surface of the P type semiconductor substrate 10. The N type wells 11C, 11D are formed by the same process as for the N type well 11B. Then, by the selective oxidation process mentioned above, a LOCOS film 12C is formed in the first high resistor element formation region 10C and a LOCOS film 12D is formed in the second high resistor element formation region 10D. The LOCOS films 12C, 12D are formed so as to surround the N type wells 11C, 11D, respectively, as shown in the figure, for example. However, the invention is not limited to this, and these may be formed so as to have other planar pattern.

Figure 1C:
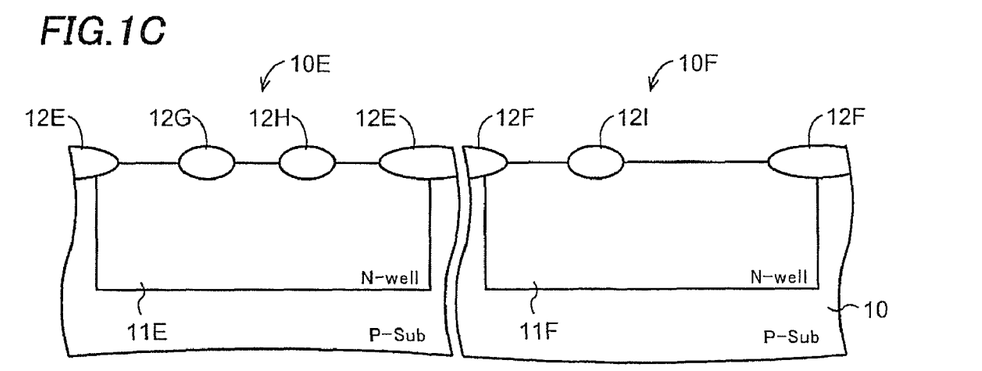

Furthermore, in a region 10E where an NPN type first bipolar transistor is to be formed (hereafter, abbreviated to a first BIP formation region 10E) and a region 10F where an NPN type second bipolar transistor is to be formed (hereafter, abbreviated to a second BIP formation region 10F) in FIG. 1C, N type wells 11E, 11F are respectively formed on the front surface of the P type semiconductor substrate 10. The N type wells 11E, 11F are formed by the same process as for the N type well 11B. The N type wells 11E, 11F are to be the collector layers of the first BIP formation region 10E and the second BIP formation region 10F, respectively.

Then, by the selective oxidation process mentioned above, LOCOS films 12E, 12G, 12H are formed in the first BIP formation region 10E, and LOCOS films 12I, 12F are formed in the second BIP formation region 10F.

Figure 2A:
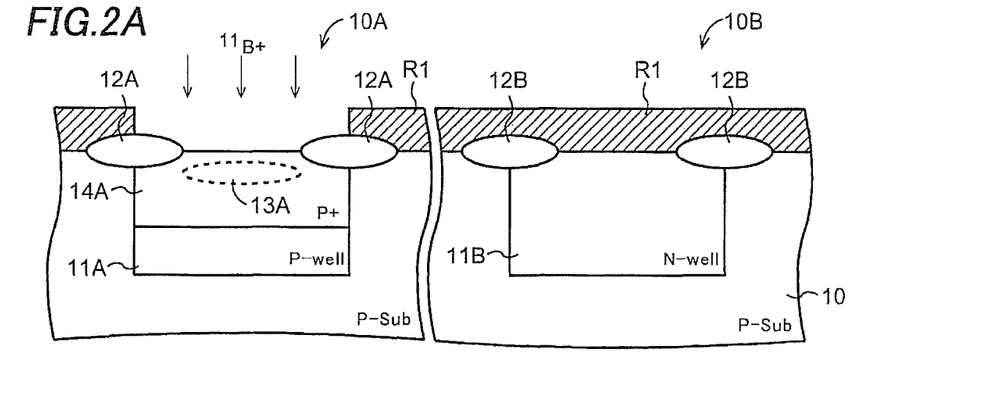

Then, as shown in FIG. 2A, the whole PMOS formation region 10B is covered by a first resist R1, and a first ion implantation is performed to the P type well 11A through an opening of the first resist R1 provided in the NMOS formation region 10A. By this, a P+ type channel stopper layer 14A is formed in the NMOS formation region 10A. Then a second ion implantation is further performed through the opening of the first resist R1 to form a P+ type punch-through prevention layer 13A.

In the first ion implantation, for example, boron ion ($^{11}B^+$) is implanted in the P type well 11A under a condition of acceleration energy of 140 KeV and a dose of $3 \times 10^{12}/cm^2$. In this case, boron ion ($^{11}B^+$) is ion-implanted under such a condition as to penetrate the LOCOS film 12A. As a result of this, the channel stopper layer 14A is formed including under the LOCOS film 12A.

This channel stopper layer 14A is a layer (an inversion prevention layer) that prevents a channel (an N type inversion layer) being formed due to the inversion of the conductivity type of the front surface of the P type well 11A under the LOCOS film 12A from P type to N type. Therefore, this channel stopper layer 14A functions enough as long as it is formed on the front surface of the P type well 11A at least under the LOCOS film 12A only. However, it is preferable that the channel stopper layer 14A is formed over the whole region in the P type well 11A where the NMOS is to be formed as shown in the figure since this achieves using the resist commonly in the first and second ion implantations.

In the second ion implantation, for example, boron ion ($^{11}B^+$) is implanted in the P type well 11A under a condition of acceleration energy of 115 KeV and a dose of $8 \times 10^{12}/cm^2$. In this case, it is preferable that boron ion ($^{11}B^+$) is implanted at lower acceleration energy than in the first ion implantation so as not to penetrate the LOCOS film 12A.

By this, the punch-through prevention layer 13A is formed in the P type well 11A except under the LOCOS film 12A. This punch-through prevention layer 13A has a peak impurity concentration at a deeper position than the front surface of the channel region of the NMOS, and thus functions to prevent a leakage current due to a punch-through between the source and drain of the NMOS in the off state.

In this manner, the punch-through prevention layer 13A and the channel stopper layer 14A are formed using the same first resist R1 in the first and second ion implantation processes.

Figure 2B:
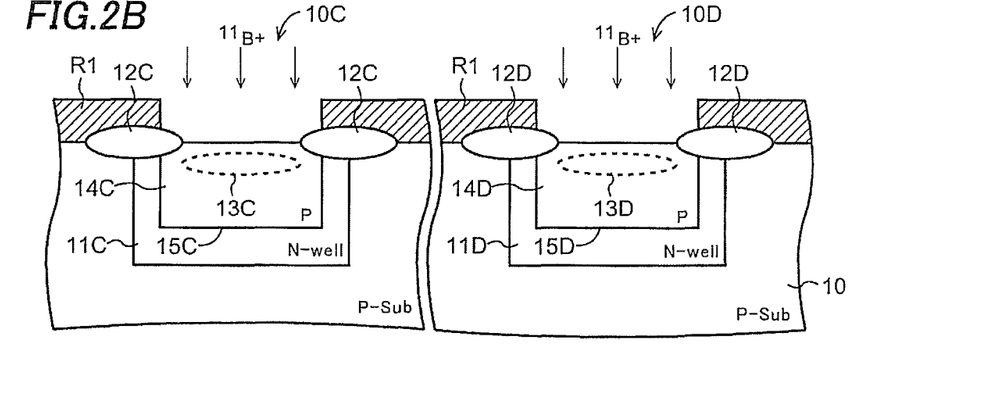

On the other hand, in the first high resistor element formation region 10C and the second high resistor element formation region 10D in FIG. 2B, the first and second ion implantations are utilized to form resistor layers 15C, 15D, respectively. In detail, the resist R1 has openings in the first high resistor element formation region 10C and the second high resistor element formation region 10D respectively, and boron ion ($^{11}B^+$) is implanted in the N type wells 11C, 11D through these openings by the first and second ion implantations.

As a result of this, in the first high resistor element formation region 10C, the P type resistor layer 15C including implantation layers 13C, 14C that are equivalent to the punch-through prevention layer 13A and the channel stopper layer 14A is formed in the N type well 11C. At the same time, in the second high resistor element formation region 10D, the P type resistor layer 15D including implantation layers 13D, 14D that are equivalent to the punch-through prevention layer 13A and the channel stopper layer 14A is formed in the N type well 11D.

In this case, the first resist R1 is formed onto the LOCOS film 12C, 12D on the end portions of the N type wells 11C, 11D to prevent ion implantation in the end portions of the N type wells 11C, 11D. By this, the P type resistor layers 15C, 15D are formed inside the N type wells 11C, 11D, respectively. Therefore, the resistor layers 15C, 15D are electrically isolated from the P type semiconductor substrate 10, and have potentials that are controllable independent of the potential of the semiconductor substrate 10.

Figure 2C:
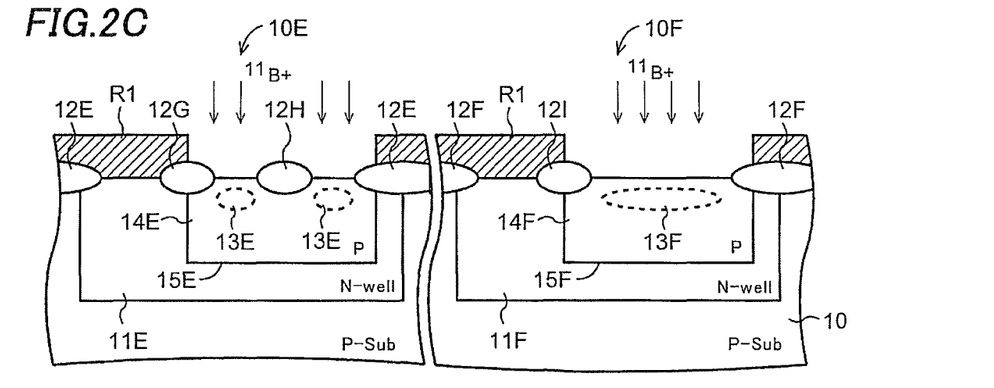

Furthermore, in the first BIP formation region 10E and the second BIP formation region 10F in FIG. 2C, the first and second ion implantations are utilized to faun P type base layers 15E, 15F. In detail, the first resist R1 has openings in the base layer formation regions, respectively, and boron ion ($^{11}B^+$) is implanted in the N type wells 11E, 11F through these openings by the first and second ion implantations.

As a result of this, in the first BIP formation region 10E, the P type base layer 15E including implantation layers 13E, 14E that are equivalent to the punch-through prevention layer 13A and the channel stopper layer 14A is formed in the N type well 11E. At the same time, in the second BIP formation region 10F, the P type base layer 15F including implantation layers 13F, 14F that are equivalent to the punch-through prevention layer 13A and the channel stopper layer 14A is formed in the N type well 11F.

By thus utilizing the first and second ion implantations, the punch-through prevention layer 13A, the channel stopper layer 14A, the resistor layers 15C, 15D, and the base layers 15E, 15F are formed using one mask (corresponding to the first resist R1).

Figure 3A:
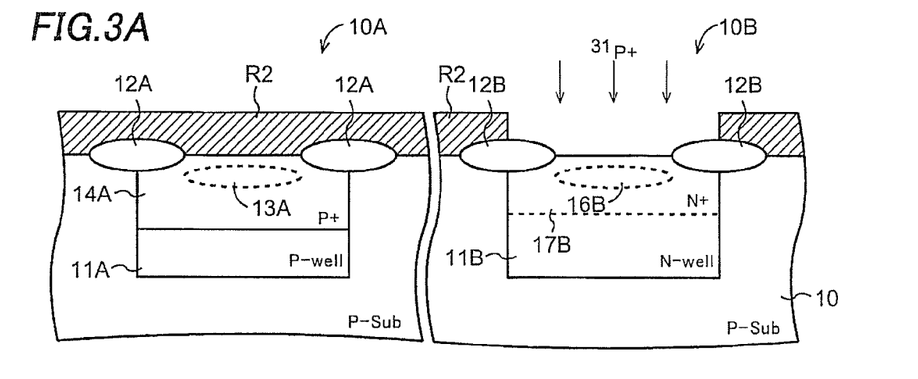

Then, as shown in FIG. 3A, after the first resist R1 is removed, the whole NMOS formation region 10A is covered by a second resist R2, and a third ion implantation is pertained to the N type well 11B through an opening of the second resist R2 provided in the PMOS formation region 10B. By this, an N+ type channel stopper layer 17B is formed in the PMOS formation region 10B. Furthermore, a fourth ion implantation is performed through the opening of the second resist R2 to form an N+ type punch-through prevention layer 16B.

In the third ion implantation, for example, phosphorus ion ($^{31}P^+$) is implanted in the N type well 11B under a condition of acceleration energy of 260 KeV and a dose of $6 \times 10^{12}/cm^2$. In this case, phosphorus ion ($^{31}P^+$) is ion-implanted under such a condition as to penetrate the LOCOS film 12B. As a result of this, the channel stopper layer 17B is formed including under the element isolation film 12B.

This channel stopper layer 17B is a layer (an inversion prevention layer) that prevents a channel (a P type inversion layer) being formed due to the inversion of the conductivity type of the front surface of the N type well 11B under the LOCOS film 12B from N type to P type. Therefore, the channel stopper layer 17B functions enough as long as it is formed on the front surface of the N type well 11B at least under the LOCOS film 12B only. However, it is preferable that the channel stopper layer 17B is formed over the whole region where the PMOS is to be formed as shown in the figure since this achieves using the resist commonly in the third and fourth ion implantations.

In the fourth ion implantation, for example, phosphorus ion ($^{31}P^+$) is implanted in the N type well 11B under a condition of acceleration energy of 140 KeV and a dose of $1 \times 10^{12}/cm^2$. In this case, phosphorus ion ($^{31}P^+$) is preferably implanted at lower acceleration energy than in the third ion implantation so as not to penetrate the LOCOS film 12B.

By this, the punch-through prevention layer 16B is formed in the N type well 11B except under the LOCOS film 12B. This punch-through prevention layer 16B has a peak impurity concentration at a deeper position than the front surface of the channel region of the PMOS, and thus functions to prevent a leakage current due to a punch-through between the source and drain of the PMOS in the off state.

In this manner, the same second resist R2 is utilized to form the punch-through prevention layer 16B and the channel stopper layer 17B in the third and fourth ion implantation processes.

Figure 3B:
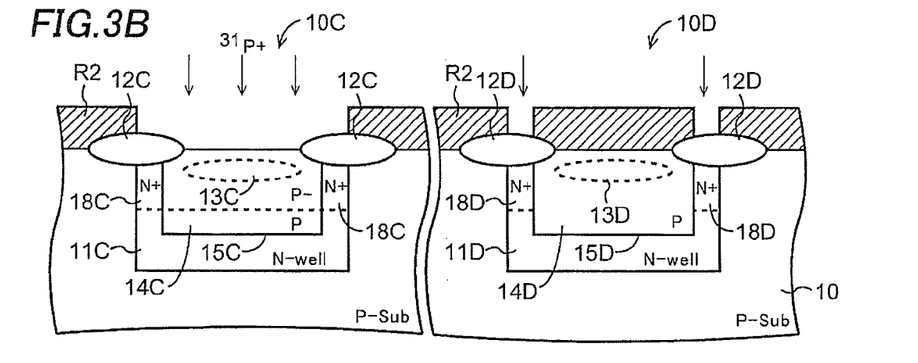

On the other hand, as shown in FIG. 3B, in the first high resistor element formation region 10C, the third and fourth ion implantations are utilized to increase the resistance of the resistor layer 15C. In the second high resistor element formation region 10D, ion implantation is not performed to the resistor layer 15D.

In detail, the second resist R2 covers the resistor layer 15D of the second high resistor element formation region 10D, and has an opening in the first high resistor element formation region 10C. Therefore, by the third and fourth ion implantations, phosphorus ion ($^{31}P^+$) is implanted in the P type resistor layer 15C of the first high resistor element formation region 10C through the opening. As a result of this, the P-type impurity concentration of the resistor layer 15C of the first high resistor element formation region 10C decreases, and thus the resistance of the resistor layer 15C increases to, for example, about 14000 Ω/square. In this manner, on the semiconductor substrate 10 where the PMOS and the NMOS are to be formed, the resistor layer 15C having a sheet resistance value on the order of MΩ/square is effectively foamed using a few masks. Furthermore, the high sheet resistance value of the resistor layer 15C achieves decreasing the area of the first high resistor element.

On the other hand, in the second high resistor element formation region 10D, ion implantation is not performed to the resistor layer 15D, and thus the sheet resistance value of the resistor layer 15D is lower than the sheet resistance value of the resistor layer 15C, for example, about 3600 Ω/square. Furthermore, by this difference in impurity concentration, the voltage dependency of the resistor layer 15D is lower than the voltage dependency of the resistor layer 15C.

Furthermore, in the first high resistor element formation region 10C, it is preferable that the end portion of the N type well 11C is not covered by the second resist R2 by disposing the end of the second resist R2 more outside from the first high resistor element formation region 10C than the end of the first resist R1. By this, by the third ion implantation, phosphorus ion ($^{31}P^+$) penetrates the LOCOS film 12C and is implanted in the end portion of the N type well 11C. This achieves forming an N+ type channel stopper layer 18C in this portion.

Similarly, in the second high resistor element formation region 10D, the second resist R2 preferably has an opening on the end portion of the N type well 11D. By this, by the third ion implantation, phosphorus ion ($^{31}P^+$) penetrates the LOCOS film 12D through this opening and is implanted in the end portion of the N type well 11D. This achieves forming an N+ type channel stopper layer 18D in this portion.

Figure 3C:
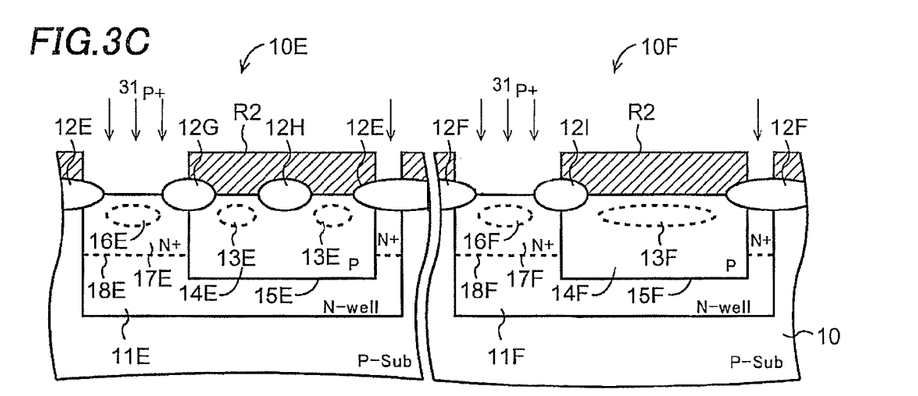

Furthermore, in the first BIP formation region 10E and the second BIP formation region 10F in FIG. 3C, the third and fourth ion implantations are utilized to increase the impurity concentrations of the N type wells 11E, 11F (the collector layers), respectively. In detail, the second resist 2 covers the base layers 15E, 15F, and has openings that expose the front surface of the N type wells 11E, 11F (the collector layers) next to the base layers 15E, 15F.

By this, by the third and fourth ion implantations, phosphorus ion ($^{31}P^+$) is implanted in the front surface of the N type well 11E (the collector layer) next to the base layer 15E in the first BIP formation region 10E to form a high concentration N+ type collector layer 18E including implantation layers 16E, 17E that are equivalent to the punch-through prevention layer 16B and the channel stopper layer 17B.

Similarly, phosphorus ion ($^{31}P^+$) is implanted in the front surface of the N type well 11F (the collector layer) next to the base layer 15F in the second BIP formation region 10F to form a high concentration N+ type collector layer 18F including implantation layers 16F, 17F that are equivalent to the punch-through prevention layer 16B and the channel stopper layer 17B.

Figure 4A:
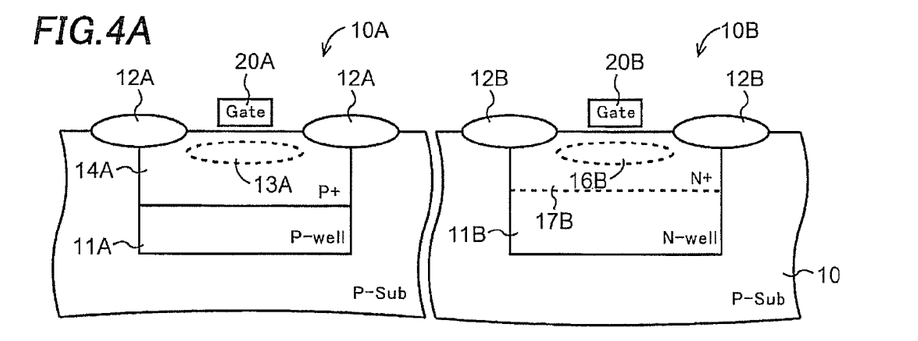
Figure 4B:
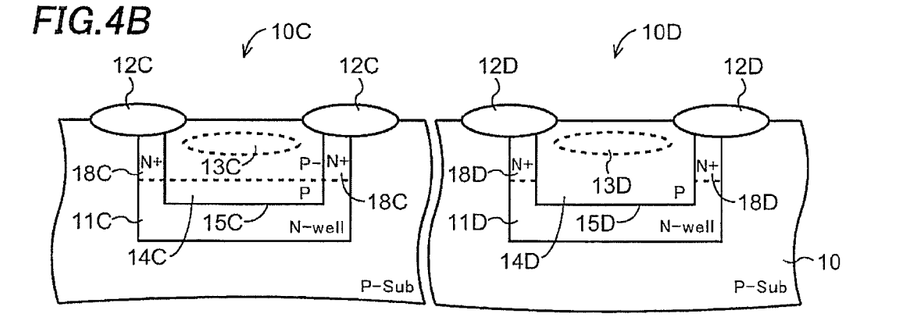
Figure 4C:
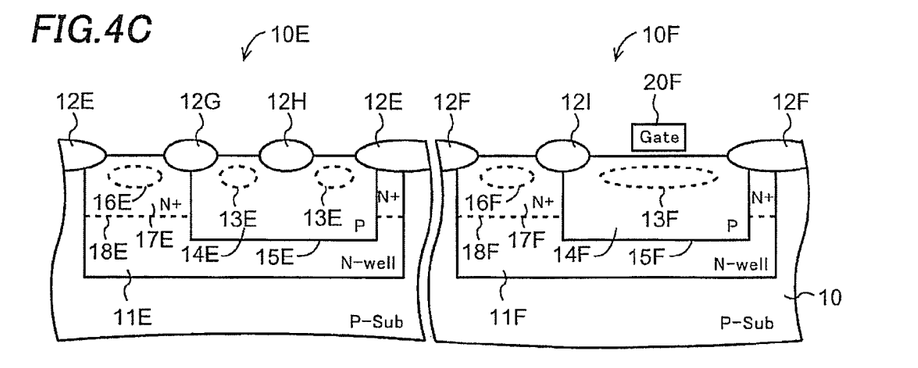

Then, as shown in FIG. 4A, gate electrodes 20A, 20B are formed in the NMOS formation region 10A and the PMOS formation region 10B, respectively, with a gate insulation film being interposed therebetween. Furthermore, as shown in FIG. 4C, a gate electrode 20F is formed on the base layer 15F in the second BIP formation region 10F with a gate insulation film interposed therebetween. The gate electrode 20F is formed by the same process as for the gate electrodes 20A, 20B. Instead of a LOCOS film, the gate electrode 20F is used to isolate the emitter from the base.

Figure 5A:
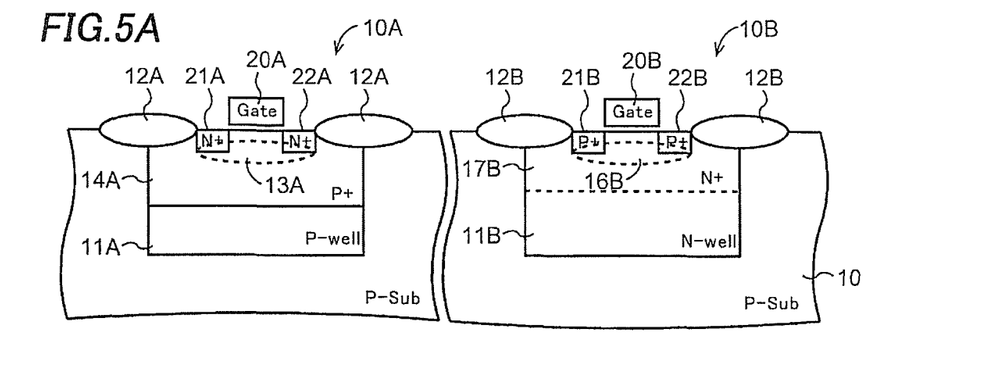

Then, as shown in FIG. 5A, in the NMOS formation region 10A, for example, arsenic ion ($^{75}As^+$) is ion-implanted to form an N+ type source layer 21A and an N+ type drain layer 22A on the front surface of the P type well 11A on both the sides of the gate electrode 20A respectively. Although this ion implantation process uses a resist (not shown) as a mask, this resist is omitted in the figure.

Figure 5B:
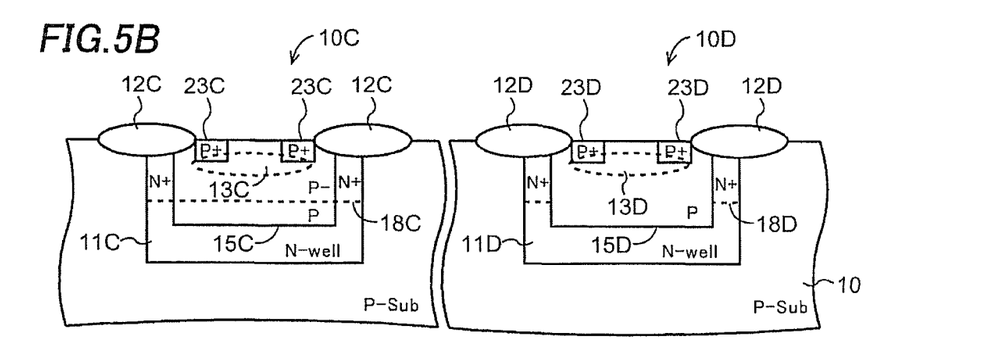
Figure 5C:
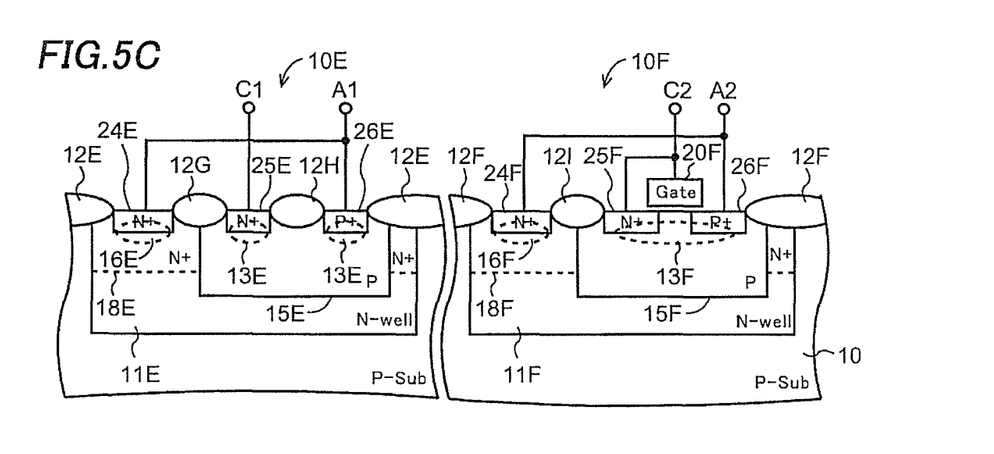

Furthermore, as shown in FIG. 5C, by utilizing this ion implantation, a high concentration N+ layer 24E for a collector wiring is formed on the front surface of the high concentration collector layer 18E in the first BIP formation region 10E. Furthermore, an N+ type emitter layer 25E is formed on the front surface of the base layer 15E. In this case, the N+ layer 24E is formed between the LOCOS films 12E, 12G and the emitter layer 25E is formed between the LOCOS films 12G, 12H by self-alignment.

Similarly, by utilizing this ion implantation, a high concentration N+ layer 24F for a collector wiring is formed on the front surface of the high concentration collector layer 18F in the second BIP formation region 10F. Furthermore, an N+ type emitter layer 25F is formed on the front surface of the base layer 15F. In this case, the N+ layer 24F is formed between the LOCOS films 12F, 12I and the emitter layer 25F is formed between the LOCOS film 12I and the gate electrode 20F by self-alignment.

Furthermore, as shown in FIG. 5A, in the PMOS formation region 10B, for example, boron ion ($^{11}B^+$) or boron fluoride ion ($^{49}BF_2^+$) is ion-implanted to form a P+ type source layer 21B and a P+ type drain layer 22B on the front surface of the N type well 11B on both the sides of the gate electrode 20B respectively. Although this ion implantation process uses a resist (not shown) as a mask, this resist is omitted in the figure.

Furthermore, as shown in FIG. 5B, by utilizing this ion implantation, a pair of P+ layers 23C, 23C for a wiring is formed on the front surface of the resistor layer 15C in the first high resistor element formation region 10C. Similarly, a pair of P+ layers 23D, 23D for a wiring are formed on the front surface of the resistor layer 15D in the second high resistor element formation region 10D.

Furthermore, as shown in FIG. 5C, by utilizing this ion implantation, a P+ layer 26E for a base wiring is formed on the front surface of the base layer 15E in the first BIP formation region 10E. In this case, the P+ layer 26E is formed between the LOCOS films 12H, 12E by self-alignment. Similarly, a P+ layer 26F for a base wiring is formed on the front surface of the base layer 15F in the second BIP formation region 10F. In this case, the P+ layer 26F is formed between the gate electrode 20F and the LOCOS film 12F by self-alignment.

Both the first BIP and second BIP are of NPN type bipolar transistors, and a difference between these is the structure of isolation between the emitter layer and the P+ layer for the base wiring. In detail, in the first BIP, the emitter layer 25E and the P+ layer 26E for the base wiring are isolated by the LOCOS film 12H. In the second BIP, the emitter layer 25F and the P+ layer 26F for the base wiring are isolated by the gate electrode 20F. The forming of the LOCOS film 12H may decrease the impurity concentration of the base layer 15E thereunder in the first BIP, but such decrease does not occur in the second BIP.

While the first BIP and second BIP thus formed are used as bipolar transistors, these may be used as diodes by diode connection as shown in FIG. 5C. In detail, in the first BIP, by a wire forming process, the N+ layer 24E and the P+ layer 26E are commonly connected to become an anode A1. The emitter layer 25E becomes a cathode C1. In the second BIP, the N+ layer 24F and the P+ layer 26F are commonly connected to become an anode A2. The emitter layer 25F and the gate electrode 20F are commonly connected to become a cathode C2.

Furthermore, wires necessary for the PMOS, the NMOS, the first high resistor element and the second high resistor element are formed by the wire forming process to form various circuits.

As described above, the embodiment provides a method of effectively forming six types of elements such as the PMOS, the NMOS, the first high resistor element, the second high resistor element, the first BIP and the second BIP on one semiconductor substrate 10 using a few masks. However, the semiconductor device does not necessarily have all of these, and the invention may be applied to forming some of these elements that are appropriately selected.

The PMOS and the NMOS in the embodiment described above have a so-called single drain structure, but the invention is not limited to this and these may be formed as an LDD structure by forming a sidewall spacer. In this case, an N-type region is formed next to the N+ type source layer 21A and drain layer 22A in the NMOS formation region 10A, and a P-type region is formed next to the P+ type source layer 21B and drain layer 22B in the PMOS formation region 10B.

Furthermore, although the P type semiconductor substrate 10 is used in the embodiment described above, an N type semiconductor substrate may be used instead. In this case, the first high resistor element and the second high resistor element are formed in the N type semiconductor substrate. Furthermore, the conductivity types of the semiconductor substrate 10, the P type well 11A, the N type well 11B, 11C, 11D, 11E, 11F, the resistor layer 15C, 15D, etc in the embodiment described above may be reversed.

What is claimed is:

1. A method of manufacturing a semiconductor device comprising a first MOS transistor with a channel of a first type and a resistor element that are formed on a semiconductor substrate, the method comprising:

forming a first element isolation film isolating a first region of the semiconductor substrate on which the first MOS transistor is formed from other portions of the semiconductor substrate;

performing a first ion implantation to form a first channel stopper layer in the first region and to form at least preliminarily a resistor layer of the resistor element in a second region of the semiconductor substrate, the first channel stopper layer preventing a channel formation under the first element isolation film;

wherein, the first channel stopper layer and the preliminary resistor layer are formed simultaneously during the first ion implantation; and performing a second ion implantation to form a first punch-through prevention layer in the first region and to add impurities to the resistor layer, the first punch-through prevention layer preventing a punch-through of the first MOS transistor;

wherein, the first punch-through prevention layer and the impurity-added resistor layer are formed simultaneously during the second ion implantation.

2. The method of claim 1, wherein the first ion implantation process is performed so that ions penetrate the first element isolation film.

3. The method of claim 2, wherein the second ion implantation process is performed so that ions do not penetrate the first element isolation film.

4. The method of claim 1, further comprising forming a second MOS transistor with a channel of a second type opposite from the channel of the first type on the semiconductor substrate, the forming of the second MOS transistor comprising:

forming a second element isolation film isolating a third region of the semiconductor substrate on which the second MOS transistor is formed from other portions of the semiconductor substrate;

performing a third ion implantation to form a second channel stopper layer in the third region, the second channel stopper layer preventing a channel formation under the second element isolation film; and performing a fourth ion implantation to form a second punch-through prevention layer in the third region, the second punch-through prevention layer preventing a punch-through of the second MOS transistor, wherein a resistance of the resistor layer is increased by the third and fourth ion implantations.

5. The method of claim 4, wherein the third ion implantation is performed so that ions penetrate the second element isolation film.

6. The method of claim 1, further comprising forming a base layer of a bipolar transistor on the semiconductor substrate by utilizing the first and second ion implantations.

7. The method of claim 6, further comprising increasing impurity concentration of a collector layer of the bipolar transistor by utilizing the third ion implantation or the fourth implantation.

8. A method of manufacturing a semiconductor device comprising a first MOS transistor with a first channel of a first conductivity type, a second MOS transistor with a second channel of a second conductivity type opposite from the first conductivity type, a first resistor element and a second resistor element that are formed on a semiconductor substrate, the method comprising:

forming a first element isolation film isolating a first region of the semiconductor substrate on which the first MOS transistor is formed from other portions of the semiconductor substrate;

forming a second element isolation film isolating a second region of the semiconductor substrate on which the second MOS transistor is formed from first other portions of the semiconductor substrate;

forming a third element isolation film isolating a third region of the semiconductor substrate on which the first resistor element is formed from second other portions of the semiconductor substrate;

forming a fourth element isolation film isolating a fourth region of the semiconductor substrate on which the second resistor element is formed from other portions of the semiconductor substrate;

implanting impurities of the first conductivity type to the semiconductor substrate so as to form a first channel stopper layer in the first region, a first resistor layer of the first resistor element in the third region and a second resistor layer of the second resistor element in the fourth region;

the first channel stopper layer preventing a channel formation under the first element isolation film;

wherein, the first channel stopper layer in the first region, the first resistor layer of the first resistor element in the third region and the second resistor layer of the second resistor element in the fourth region are formed simultaneously;

and implanting impurities of the second conductivity type to the semiconductor substrate so as to form a second channel stopper layer in the second region and so as to make a resistance of the first resistor layer higher than a resistance of the second resistor layer, the second channel stopper layer preventing a channel formation under the second element isolation film.

* * * * *